US010450804B2

(12) United States Patent
Chen

(10) Patent No.: US 10,450,804 B2
(45) Date of Patent: Oct. 22, 2019

(54) IDENTIFICATION OF WEAK ZONES IN ROTARY DRILL BITS DURING OFF-CENTER ROTATION

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 258 days.

(21) Appl. No.: 15/308,931

(22) PCT Filed: Jun. 10, 2014

(86) PCT No.: PCT/US2014/041653
§ 371 (c)(1),
(2) Date: Nov. 4, 2016

(87) PCT Pub. No.: WO2015/191040
PCT Pub. Date: Dec. 17, 2015

(65) Prior Publication Data
US 2017/0074045 A1    Mar. 16, 2017

(51) Int. Cl.
*E21B 10/43*    (2006.01)
*E21B 10/00*    (2006.01)
(Continued)

(52) U.S. Cl.
CPC ............. *E21B 10/43* (2013.01); *E21B 10/00* (2013.01); *G01B 21/00* (2013.01); *G06F 17/5086* (2013.01); *E21B 2010/425* (2013.01)

(58) Field of Classification Search
CPC .......................... E21B 10/43; E21B 2010/425
See application file for complete search history.

(56) References Cited

U.S. PATENT DOCUMENTS

| 4,475,606 A | 10/1984 | Crow |
| 5,979,577 A | 11/1999 | Fielder |

(Continued)

FOREIGN PATENT DOCUMENTS

| WO | 2013/180702 | 12/1923 |
| WO | 2010/123954 | 10/2010 |

(Continued)

OTHER PUBLICATIONS

International Search Report and Written Opinion, Application No. PCT/US2014/041653; 11 pgs, dated Feb. 17, 2015.

(Continued)

*Primary Examiner* — Giovanna C Wright
(74) *Attorney, Agent, or Firm* — Baker Botts L.L.P.

(57) ABSTRACT

A method of designing a drill bit is disclosed. The method includes determining a location of a bit coordinate system in a wellbore coordinate system and generating a bit profile based on an angular coordinate around a wellbore axis of a wellbore and the location of the bit coordinate system. The bit profile is based on a cutting edge of a first cutting element on an exterior portion of a first blade. The method also includes determining a cutting layer volume based on the bit profile and identifying a weak zone based on the cutting layer volume being less than a predefined minimum cutting layer volume. The method includes determining a location for a second cutting element on the exterior portion of a second blade based on the weak zone.

8 Claims, 12 Drawing Sheets

(51) Int. Cl.
   *G01B 21/00* (2006.01)
   *G06F 17/50* (2006.01)
   *E21B 10/42* (2006.01)

(56) References Cited

U.S. PATENT DOCUMENTS

| | | |
|---|---|---|
| 6,151,960 A | 11/2000 | Taylor et al. |
| 6,659,207 B2 | 12/2003 | Hoffmaster et al. |
| 7,292,967 B2 | 11/2007 | McDonough et al. |
| 8,316,967 B2 | 11/2012 | Gavia |
| 8,437,995 B2 | 5/2013 | Matthews et al. |
| 8,606,552 B2 | 12/2013 | Chen |
| 2002/0157869 A1 | 10/2002 | Glass et al. |
| 2007/0106487 A1 | 5/2007 | Gavia et al. |
| 2011/0079438 A1 | 4/2011 | Schwefe et al. |
| 2011/0240376 A1 | 10/2011 | Chen |
| 2013/0035903 A1 | 2/2013 | Prevost et al. |
| 2013/0043077 A1 | 2/2013 | Chen |
| 2013/0228378 A1 | 9/2013 | Chen et al. |
| 2013/0253836 A1 | 9/2013 | Chen |
| 2014/0110181 A1 | 4/2014 | Zhang et al. |
| 2015/0275584 A1* | 10/2015 | Mensa-Wilmot ....... E21B 10/43 175/431 |

FOREIGN PATENT DOCUMENTS

| | | |
|---|---|---|
| WO | 2013/176664 | 11/2013 |
| WO | 2014/011197 | 1/2014 |
| WO | 2014/012038 | 1/2014 |

OTHER PUBLICATIONS

Product Catalog, Smith Bits, available at http://www.slb.com/~/media/Files/smith/catalogs/bits_catalog.pdf☐, 2013.

* cited by examiner

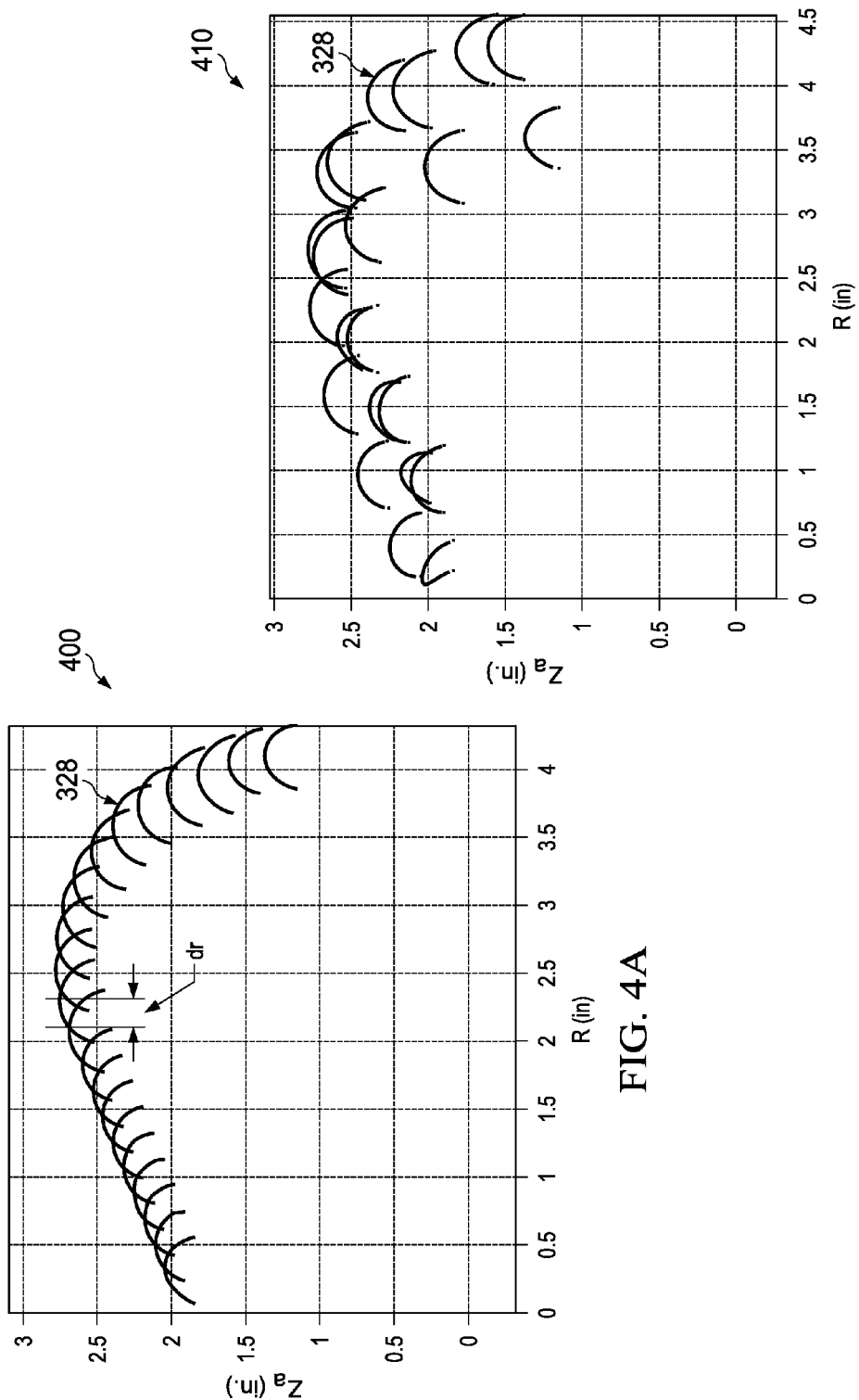

IDENTIFICATION OF WEAK ZONES IN ROTARY DRILL BITS DURING OFF-CENTER ROTATION

RELATED APPLICATIONS

This application is a U.S. National Stage Application of International Application No. PCT/US2014/041653 filed Jun. 10, 2014, which designates the United States, and which is incorporated herein by reference in its entirety.

TECHNICAL FIELD

The present disclosure relates generally to downhole drilling tools and, more particularly, to identification of weak zones in rotary drill bits during off-center rotation.

BACKGROUND

Various types of tools are used to form wellbores in subterranean formations for recovering hydrocarbons such as oil and gas lying beneath the surface. Examples of such tools include rotary drill bits, hole openers, reamers, and coring bits. Rotary drill bits include, but are not limited to, fixed cutter drill bits, such as polycrystalline diamond compact (PDC) drill bits, drag bits, matrix drill bits, rock bits, and roller cone drill bits. A fixed cutter drill bit typically includes multiple blades each having multiple cutting elements, such as the PDC cutting elements on a PDC bit.

In typical drilling applications, a drill bit is rotated to form a wellbore. The diameter of the wellbore formed by the drill bit may be defined by the cutting elements disposed at the largest outer diameter of the drill bit. The drill bit is coupled, either directly or indirectly to a "drill string," which includes a series of elongated tubular segments connected end-to-end. An assembly of components, referred to as a "bottom-hole assembly" (BHA) may be connected to the downhole end of the drill string. When the axis of the BHA and the axis of drill bit are not in alignment, the drill bit may, as a whole, rotate around the BHA axis. This is called off-center rotation of the drill bit.

BRIEF DESCRIPTION OF THE DRAWINGS

A more complete understanding of the present disclosure and its features and advantages thereof may be acquired by referring to the following description, taken in conjunction with the accompanying drawings, in which like reference numbers indicate like features, and wherein:

FIGS. 4A and 4B illustrate schematic drawings for bit face profiles of the drill bit of FIG. 3B, in accordance with some embodiments of the present disclosure;

DETAILED DESCRIPTION

A drill bit model and related systems and methods are disclosed, directed to identification of weak zones in drill bits that may occur during off-center rotation. In broad terms, one aspect of the disclosed model takes into consideration determining the location of bit coordinates in wellbore coordinate systems. Multiple bit profiles are generated based on various angles around the axis of the wellbore. Based on the bit profiles, cutting layer material volumes are calculated and weak zones on the drill bit are identified. Weak zones are areas where the cutting layer of individual cutting elements may be worn such that the cutting layer volume is less than a predefined minimum cutting layer volume. To compensate for the weak zones, additional cutting elements may be configured on the drill bit. Thus, embodiments of the present disclosure and its advantages are best understood by referring to FIGS. 1 through 10, where like numbers are used to indicate like and corresponding parts.

Figure 1:
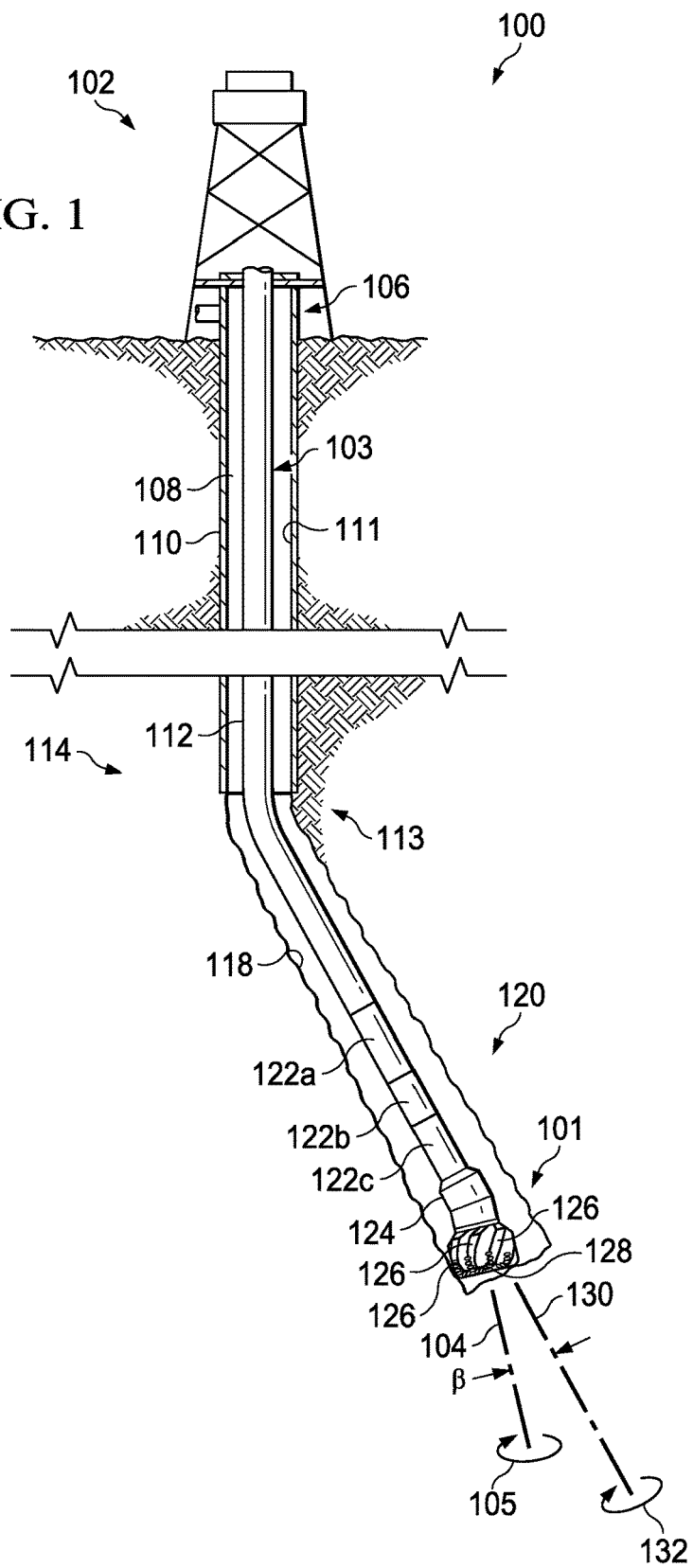
FIG. 1 illustrates an elevation view of an example embodiment of a drilling system, in accordance with some embodiments of the present disclosure.

FIG. 1 illustrates an elevation view of an example embodiment of a drilling system 100, in accordance with some embodiments of the present disclosure. Drilling system 100 is configured to provide drilling into one or more geological formations, in accordance with some embodiments of the present disclosure. Drilling system 100 may include a well surface, sometimes referred to as "well site" 106. Various types of drilling equipment such as a rotary table, mud pumps and mud tanks (not expressly shown) may be located at a well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may include drill string 103 associated with drill bit 101 that may be used to form a wide variety of wellbores or bore holes such as generally vertical wellbore, generally horizontal wellbore and/or a wellbore that descends vertically and then descends at a predefined angle as shown in FIG. 1. Various directional drilling techniques and associated components of bottom hole assembly (BHA) 120 of drill string 103 may be used to form wellbore 114. For example, lateral forces may be applied to drill bit 101 proximate kickoff location 113 to form angled portions of wellbore 114 extending from generally vertical portions of wellbore 114.

The term "directional drilling" may be used to describe drilling a wellbore or portions of a wellbore that extend at a desired angle or angles relative to vertical. Such angles may be greater than normal variations associated with vertical wellbores. Direction drilling may also be described as drilling a wellbore deviated from vertical. The term "horizontal drilling" may be used to include drilling in a direction approximately ninety degrees (90°) from vertical.

BHA 120 may be formed from a wide variety of components configured to form a wellbore 114. For example, components 122a, 122b and 122c of BHA 120 may include, but are not limited to, drill bits (e.g., drill bit 101) drill collars, rotary steering tools, directional drilling tools, downhole drilling motors, drilling parameter sensors for weight, torque, bend and bend direction measurements of the drill string and other vibration and rotational related sensors, hole enlargers such as reamers, under reamers or hole openers, stabilizers, measurement while drilling (MWD) components containing wellbore survey equipment, logging while drilling (LWD) sensors for measuring formation parameters, short-hop and long haul telemetry systems used for communication, and/or any other suitable downhole equipment. The number of components such as drill collars and different types of components 122 included in BHA 120 may depend upon anticipated downhole drilling conditions and the type of wellbore that will be formed by drill string 103 and rotary drill bit 101. BHA 120 may also include various types of well logging tools (not expressly shown) and other downhole tools associated with directional drilling of a wellbore. Examples of such logging tools and/or directional drilling tools may include, but are not limited to, acoustic, neutron, gamma ray, density, photoelectric, nuclear magnetic resonance, rotary steering tools and/or any other commercially available well tool.

Wellbore 114 may be defined in part by casing string 110 that may extend from well surface 106 to a selected downhole location. Portions of wellbore 114 as shown in FIG. 1 that do not include casing string 110 may be described as "open hole." In addition, liner sections (not expressly shown) may be present and may connect with an adjacent casing or liner section. Liner sections (not expressly shown) may not extend to the well site 106. Liner sections may be positioned proximate the bottom, or downhole, from the previous liner or casing. Liner sections may extend to the end of wellbore 114. The terms "uphole" and "downhole" may be used to describe the location of various components of drilling system 100 relative to the bottom or end of wellbore 114. For example, a first component described as uphole from a second component may be further away from the end of wellbore 114 than the second component. Similarly, a first component described as being downhole from a second component may be located closer to the end of wellbore 114 than the second component.

Various types of drilling fluid may be pumped from well surface 106 through drill string 103 to attached drill bit 101. Such drilling fluids may be directed to flow from drill string 103 to respective nozzles (item 256 illustrated in FIG. 2) included in rotary drill bit 101. The drilling fluid may be circulated back to well surface 106 through an annulus 108 defined in part by outside diameter 112 of drill string 103 and inside diameter 118 of wellbore 114. Inside diameter 118 may be referred to as the "sidewall" or "bore wall" of wellbore 114. Annulus 108 may also be defined by outside diameter 112 of drill string 103 and inside diameter 111 of casing string 110. Open hole annulus 116 may be defined as sidewall 118 and outside diameter 112.

Drilling system 100 may also include rotary drill bit ("drill bit") 101. Drill bit 101, discussed in further detail in FIG. 2A, may include one or more blades 126 that may be disposed outwardly from exterior portions of rotary bit body 124 of drill bit 101. Rotary bit body 124 may have a generally cylindrical body and blades 126 may be any suitable type of projections extending outwardly from rotary bit body 124. Blades 126 may include one or more cutting elements 128 disposed outwardly from exterior portions of each blade 126. Blades 126 may include one or more depth of cut controllers (not expressly shown) configured to control the depth of cut of cutting elements 128. Blades 126 may further include one or more gage pads (not expressly shown) disposed on blades 126. Drill bit 101 may be designed and formed in accordance with teachings of the present disclosure and may have many different designs, configurations, and/or dimensions according to the particular application of drill bit 101.

In the illustrated embodiment, an oversized wellbore, such as wellbore 114, may be drilled by a drill bit, such as drill bit 101 or other fixed cutter PDC bit. The wellbore may be oversized due to bit vibrations, bit tilting, BHA vibrations, and/or misalignment of the bit axis and the BHA axis. When drill bit 101 rotates around a BHA axis that is misaligned with bit axis 104, then drill bit 101 may be in "off-center rotation." Drill bit off-center rotation may also occur in downhole motor applications when the motor is unable to rotate drill bit 101 while BHA 120 is rotating. Additionally, drill bit off-center rotation may occur when drill bit 101 is in stick phase of stick-slip vibration while BHA 120 is rotating. Drill bit off-center rotation may occur in a variety of drilling operations, including vertical drilling and directional drilling. However, drill bit 101 may be designed by assuming drill bit 101 is rotating around bit axis 104. Uneven wear on cutting elements 128 during off-center rotation may create weak zones on drill bit 101 where cutting elements 128 do not effectively cut into the formation. Weak zones may reduce the life of a drill bit or result in less efficient drilling. Thus, identifying weak zones and designing improvements to compensate for weak zones may improve the life and effectiveness of a drill bit.

Figure 2A:
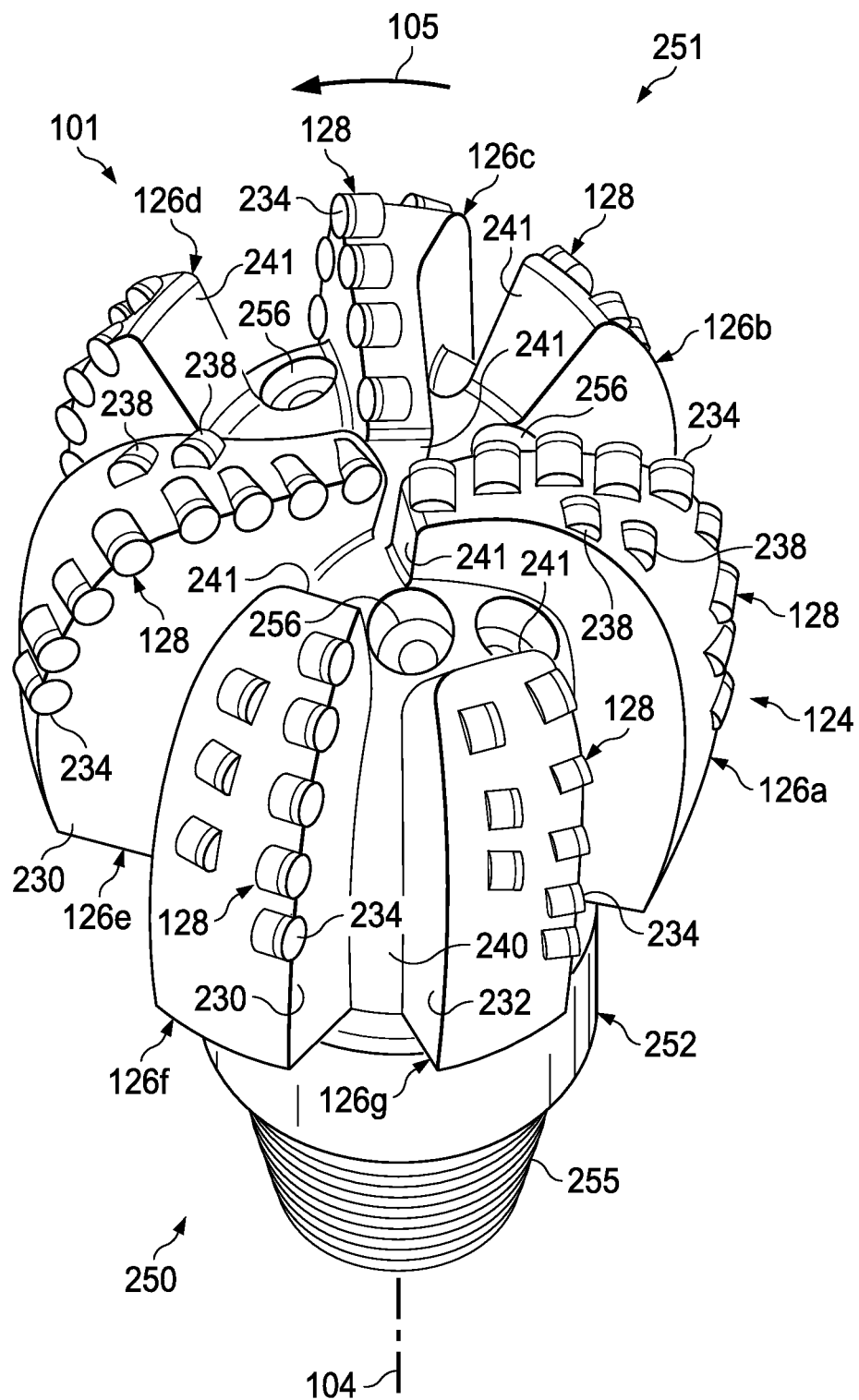
FIG. 2A illustrates an isometric view of a drill bit oriented upwardly in a manner often used to model or design fixed cutter drill bits, in accordance with some embodiments of the present disclosure.

FIG. 2A illustrates an isometric view of drill bit 101 oriented upwardly in a manner often used to model or design fixed cutter drill bits, in accordance with some embodiments of the present disclosure. Drill bit 101 may be any of various types of fixed cutter drill bits, including PDC bits, drag bits, matrix drill bits, and/or steel body drill bits operable to form wellbore 114 extending through one or more downhole formations. Drill bit 101 may be designed and formed in accordance with teachings of the present disclosure and may have many different designs, configurations, and/or dimensions according to the particular application of drill bit 101.

Drill bit 101 may include one or more blades 126 (e.g., blades 126a-126g) that may be disposed outwardly from exterior portions of rotary bit body 124 of drill bit 101. Rotary bit body 124 may be generally cylindrical and blades 126 may be any suitable type of projections extending outwardly from rotary bit body 124. For example, a portion of blade 126 may be directly or indirectly coupled to an exterior portion of bit body 124, while another portion of blade 126 may be projected away from the exterior portion of bit body 124. Blades 126 formed in accordance with teachings of the present disclosure may have a wide variety of configurations including, but not limited to, substantially arched, helical, spiraling, tapered, converging, diverging, symmetrical, and/or asymmetrical.

In some embodiments, blades 126 may have substantially arched configurations, generally helical configurations, spiral shaped configurations, or any other configuration satisfactory for use with each downhole drilling tool. One or more blades 126 may have a substantially arched configuration extending from proximate bit axis 104 of drill bit 101. The arched configuration may be defined in part by a generally concave, recessed shaped portion extending from proximate bit axis 104. The arched configuration may also be defined in part by a generally convex, outwardly curved portion disposed between the concave, recessed portion and exterior portions of each blade which correspond generally with the outside diameter of the rotary drill bit. Each of blades 126 may include a first end disposed proximate or toward bit axis 104 and a second end disposed proximate or toward exterior portions of drill bit 101 (e.g., disposed generally away from bit axis 104 and toward uphole portions of drill bit 101).

Blades 126a-126g may include primary blades disposed about the bit axis. For example, in FIG. 2A, blades 126a, 126c, and 126e may be primary blades or major blades because respective first ends 141 of each of blades 126a, 126c, and 126e may be disposed closely adjacent to bit axis 104 of drill bit 101. In some embodiments, blades 126a-126g may also include at least one secondary blade disposed between the primary blades. In the illustrated embodiment, blades 126b, 126d, 126f, and 126g shown in FIG. 2A on drill bit 101 may be secondary blades or minor blades because respective first ends 241 may be disposed on downhole end 251 of drill bit 101 a distance from associated bit axis 104. The number and location of primary blades and secondary blades may vary such that drill bit 101 includes more or less primary and secondary blades. Blades 126 may be disposed symmetrically or asymmetrically with regard to each other and bit axis 104 where the location of blades 126 may be based on the downhole drilling conditions of the drilling environment. In some cases, blades 126 and drill bit 101 may rotate about bit axis 104 in a direction defined by directional arrow 105.

Each blade may have leading (or front) surface (or face) 230 disposed on one side of the blade in the direction of rotation of drill bit 101 and trailing (or back) surface (or face) 232 disposed on an opposite side of the blade away from the direction of rotation of drill bit 101. Blades 126 may be positioned along bit body 124 such that they have a spiral configuration relative to bit axis 104. In other embodiments, blades 126 may be positioned along bit body 124 in a generally parallel configuration with respect to each other and bit axis 104.

Blades 126 may include one or more cutting elements 128 disposed outwardly from exterior portions of each blade 126. For example, a portion of cutting element 128 may be directly or indirectly coupled to an exterior portion of blade 126 while another portion of cutting element 128 may be projected away from the exterior portion of blade 126. By way of example and not limitation, cutting elements 128 may be various types of cutters, compacts, buttons, inserts, and gage cutters satisfactory for use with a wide variety of drill bits 101.

Cutting elements 128 and 238 may be any suitable device configured to cut into a formation, including but not limited to, primary cutting elements, back-up cutting elements, secondary cutting elements or any combination thereof. Primary cutting elements may be described as first layer or second layer cutting elements. First layer cutting elements may be disposed on leading surfaces 230 of primary blades, e.g. blades 126a, 126c, and 126e. Second layer cutting elements may be disposed on leading surfaces 130 of secondary blades, e.g., blades 126b, 126d, 126f, and 126g.

In some embodiments, secondary cutting elements 238 may be placed on blades 126 to minimize or compensate for weak zones of a drill bit used during off-center rotation. Weak zones may be determined in accordance with FIGS. 6A-7 discussed below. Placement of secondary cutting elements 238 may be based on a variety of placement techniques. For example, secondary cutting elements 238 may be configured as backup cutting elements on the primary blades behind the primary cutting elements. As another example, secondary cutting elements 238 may be placed on secondary blades. Secondary cutting elements 238 may be track set or single set. Track set cutting elements have radial correspondence such that they are at the same radial position with respect to bit axis 104.

Cutting elements 128 and 238 may include respective substrates with a layer of hard cutting material, cutting layer 234, disposed on one end of each respective substrate. The hard layer of cutting elements 128 and 238 may provide a cutting surface that may engage adjacent portions of a downhole formation to form wellbore 114. The contact of the cutting surface with the formation may form a cutting zone associated with each of cutting elements 128 and 238. The edge of the cutting surface located within the cutting zone may be referred to as the cutting edge of a cutting element 128 and 238.

Each substrate of cutting elements 128 and 238 may have various configurations and may be formed from tungsten carbide or other suitable materials associated with forming cutting elements for rotary drill bits. Tungsten carbides may include, but are not limited to, monotungsten carbide (WC), ditungsten carbide (W$_2$C), macrocrystalline tungsten carbide and cemented or sintered tungsten carbide. Substrates may also be formed using other hard materials, which may include various metal alloys and cements such as metal borides, metal carbides, metal oxides and metal nitrides. For some applications, cutting layer 234 may be formed from substantially the same materials as the substrate. In other applications, cutting layer 234 may be formed from different materials than the substrate. Examples of materials used to form cutting layers 234 may include polycrystalline diamond materials, including synthetic polycrystalline diamonds.

In some embodiments, blades 126 may also include one or more depth of cut controllers (DOCCs) (not expressly shown) configured to control the depth of cut of cutting elements 128. A DOCC may include an impact arrestor, a back-up or second layer cutting element and/or a Modified Diamond Reinforcement (MDR). Exterior portions of blades 126, cutting elements 128 and 238, and DOCCs (not expressly shown) may form portions of the bit face.

Blades 126 may further include one or more gage pads (not expressly shown) disposed on blades 126. A gage pad may be a gage, gage segment, or gage portion disposed on exterior portion of blade 126. Gage pads may contact adjacent portions of wellbore 114 formed by drill bit 101. Exterior portions of blades 126 and/or associated gage pads may be disposed at various angles, positive, negative, and/or parallel, relative to adjacent portions of wellbore 114. A gage pad may include one or more layers of hardfacing material.

Uphole end 250 of drill bit 101 may include shank 252 with drill pipe threads 255 formed thereon. Threads 255 may be used to releasably engage drill bit 101 with BHA 120 whereby drill bit 101 may be rotated relative to bit axis 104. Downhole end 251 of drill bit 101 may include a plurality of blades 126a-126g with respective junk slots or fluid flow paths 240 disposed therebetween. Additionally, drilling fluids may be communicated to one or more nozzles 256.

Figure 2B:
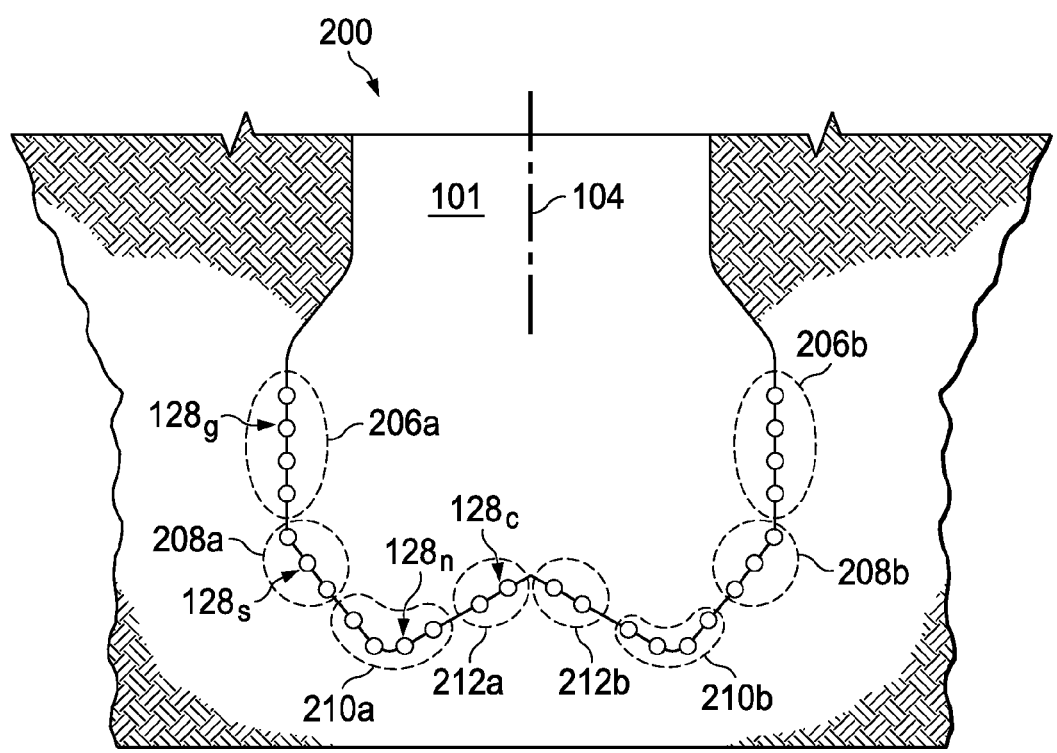
FIG. 2B illustrates a bit face profile of a drill bit configured to form a wellbore, in accordance with some embodiments of the present disclosure.

FIG. 2B illustrates bit face profile 200 of drill bit 101 configured to form a wellbore, in accordance with some embodiments of the present disclosure. Exterior portions of blades (not expressly shown), cutting elements 128 and DOCCs (not expressly shown) may be projected rotationally onto a radial plane to form bit face profile 200.

As shown in FIG. 2B, exterior portions of drill bit 101 that contact adjacent portions of a downhole formation may be described as a "bit face." Bit face profile 200 of drill bit 101 may include various zones or segments. Bit face profile 200 may be substantially symmetric about bit axis 104 due to the rotational projection of bit face profile 200, such that the zones or segments on one side of bit axis 104 may be substantially similar to the zones or segments on the opposite side of bit axis 104.

For example, bit face profile 200 may include gage zone 206a located opposite gage zone 206b, shoulder zone 208a located opposite shoulder zone 208b, nose zone 210a located opposite nose zone 210b, and cone zone 212a located opposite cone zone 212b. Cutting elements 128 included in each zone may be referred to as cutting elements of that zone. For example, cutting elements $128_g$ included in gage zones 206 may be referred to as gage cutting elements, cutting elements $128_g$ included in shoulder zones 208 may be referred to as shoulder cutting elements, cutting elements $128_n$ included in nose zones 210 may be referred to as nose cutting elements, and cutting elements $128_c$ included in cone zones 212 may be referred to as cone cutting elements.

Cone zones 212 may be generally concave and may be formed on exterior portions of each blade (e.g., blades 126 as illustrated in FIG. 2A) of drill bit 101, adjacent to and extending out from bit axis 104. Nose zones 210 may be generally convex and may be formed on exterior portions of each blade of drill bit 101, adjacent to and extending from each cone zone 212. Shoulder zones 208 may be formed on exterior portions of each blade 126 extending from respective nose zones 210 and may terminate proximate to respective gage zone 206. In some embodiments, identification of weak zones during off-center drilling may be based on the bit face zones where cutting elements 128 are located.

In some embodiments, as discussed with reference to FIG. 2A, secondary cutting elements 238 may be placed on blades 126 to minimize or compensate for weak zones of a drill bit during off-center rotation. Weak zones may be determined in accordance with FIGS. 6A-7 discussed below. Based on the location of weak zones, additional cutting elements (e.g., secondary cutting elements 238), may be placed in various zones. For example, if weak zones are identified in cone zone 212 and/or nose zone 210, additional cutting elements may be placed in cone zone 212 and/or nose zone 210, respectively.

Figure 3A:
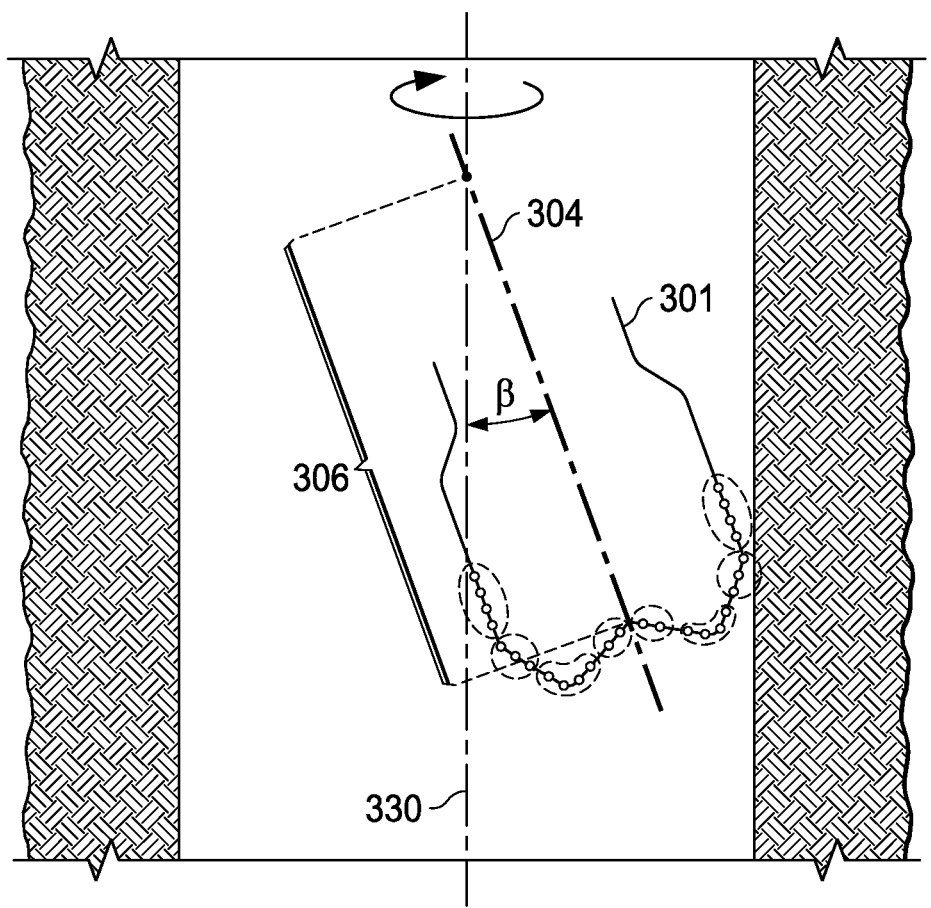
FIG. 3A illustrates a schematic drawing for a drill bit with a bit axis that is misaligned from the wellbore (or BHA) axis, in accordance with some embodiments of the present disclosure.

FIG. 3A illustrates a schematic drawing for drill bit 301 with bit axis 304 that is misaligned from wellbore (or BHA) axis 330, in accordance with some embodiments of the present disclosure. Wellbore axis 330 may be the axis about which the BHA and/or drill string rotates during drilling. The angular difference between bit axis 304 and wellbore axis 330 may be angle β. Bend length 306 may be the length of drill bit 301 that is in off-center rotation.

Weak zones may be areas in which the cutting layer of individual cutting elements are worn such that the cutting layer volume is less than a predefined minimum cutting layer volume. Weak zones may be created during drilling operations when bit axis 304 is misaligned from wellbore axis 330. During off-center rotation, cutting elements contact the formation in an uneven manner because the drill bit is rotating simultaneously to the BHA rotating. Thus, the cutting faces of the cutting elements may wear in an uneven manner and the cutting layer volume may decrease unevenly. When the cutting layer volume is less than a predefined cutting layer volume, a weak zone may exist.

Figure 3B:
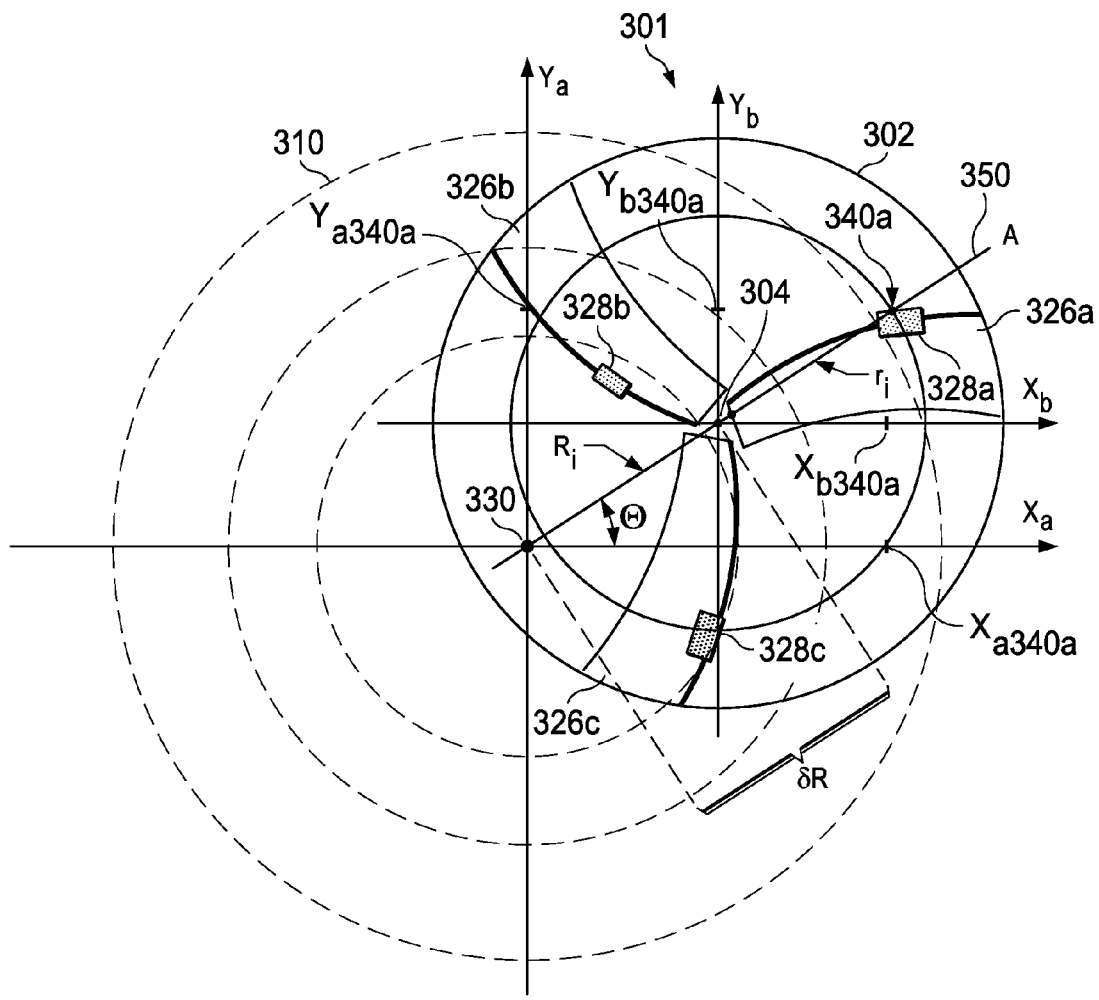
FIG. 3B illustrates a schematic drawing for a bit face of a drill bit that has a bit axis off-center from a wellbore axis, in accordance with some embodiments of the present disclosure.

FIG. 3B illustrates a schematic drawing for bit face 302 of drill bit 301 that has bit axis 304 off-center from wellbore axis 330, in accordance with some embodiments of the present disclosure. FIG. 3B may include bit face 302 of drill bit 301 and wellbore cross-section 310 of wellbore 114 (discussed with reference to FIG. 1). Bit face 302 may be a projection of the downhole profile of drill bit 301. FIG. 3B depicts a three-bladed drill bit 301. However, drill bit 301 may include more or fewer blades than shown in FIG. 3B without departing from the scope of the present disclosure.

Radial coordinate R indicates the orthogonal distance of a point on bit face 302 from wellbore axis 330. For example, bit axis 304 at bit center may be off-center from wellbore axis 330 by distance δR due to angle β. When drill bit 301 rotates off-center around wellbore axis 330, bit axis 304 rotates about wellbore axis 330 and blades 326 with cutting elements 328 rotate about wellbore axis 330.

In some embodiments, each cutting element 328 may have an associated cutlet point 340 on the cutting edge of the cutting element. For example, cutlet point 340a may be associated with the cutting edge of cutting element 328a. A bit profile under off-center rotation may be obtained by rotationally projecting all cutting edges and cutlet points, also referred to as "cutlets," of cutting elements 328 on to a radial plane. For example, radial plane 350 may extend from wellbore axis 330 through bit axis 304. Generating a bit profile for off-center rotation may assist in identifying weak zones on drill bit 301 and compensating for cutting element wear during off-center rotation.

In some embodiments, a location of a feature of drill bit 301 (e.g., a cutlet point) may be defined in reference to bit face 302. For example, a location on bit face 302 of drill bit 301 may be defined by $X_b$ and $Y_b$ coordinates of an xy-plane of bit face 302. The distance from bit axis 304 of drill bit 301 to a point in the xy-plane of bit face 302 may indicate the radial coordinate or radial position of the point on the bit face profile. The radial coordinate, $r_i$, of a point in the xy-plane having an x-coordinate, $X_b$, and a y-coordinate, $Y_b$, is expressed by the following equation:

$$r_i = \sqrt{X_b^2 + Y_b^2}$$

For example, as illustrated in FIG. 3, cutlet point 340a associated with a cutting edge of cutting element 328a may have an x-coordinate $X_{b340a}$ and a y-axis coordinate $Y_{b340a}$ in the xy-plane. $X_{b340a}$ and $Y_{b340a}$ may be used to calculate a radial coordinate $r_{340a}$ of cutlet point 340a (e.g., $r_{340a}$ may be equal to the square root of $X_{b340a}$ squared plus $Y_{b340a}$ squared). Accordingly, $r_{340a}$ may indicate an orthogonal distance of cutlet point 340a from bit axis 304 of drill bit 301.

In some embodiments, during off-center drilling, a location of drill bit 301 (e.g., a cutlet point) along bit face 302 may additionally be described by $X_a$ and $Y_a$ coordinates of an xy-plane of wellbore cross-section 310. Thus, cutlet 340a may also be described in reference to wellbore axis 330. For example, cutlet 340a may be described by x-coordinate, $X_{a340a}$, and y-coordinate, $Y_{a340a}$. The radial coordinate, $R_i$, of a point in the xy-plane of wellbore cross-section 310 having an x-coordinate, $X_a$, and a y-coordinate, $Y_a$, is expressed by the following equation:

$$R_i = \sqrt{(X_b + X_a)^2 + (Y_b + Y_a)^2}.$$

For example, cutlet point 340a associated with a cutting edge of cutting element 328a may have x-coordinates, $X_{a340a}$ and $X_{b340a}$, and y-coordinates, $Y_{a340a}$ and $Y_{b340a}$, in the xy-plane based on BHA cross-section 310 and bit face 302 of drill bit 301, respectively. $X_{a340a}$, $X_{b340a}$, $Y_{a340a}$, and $Y_{b340a}$ may be used to calculate a radial coordinate ($R_{340a}$) of cutlet point 340a.

Additionally, each cutlet point may have an angular coordinate θ that may be the angle between the $X_a$-axis and radial plane 350 extending orthogonally from wellbore axis 330 through bit axis 304. The angular coordinate (θ) is expressed by the following equation:

$$\theta_i = \arctan(Y_a/X_a).$$

For example, $\theta_{340a}$ may be equal to arctan ($X_{a340a}/Y_{a340a}$).

Further, cutlet point 340a may have an axial coordinate $Z_{a340a}$ that may represent a position of cutlet point 340a along BHA axis 330 (discussed in more detail with reference to FIGS. 4A and 4B below).

The cited coordinates and coordinate systems are used for illustrative purposes only, and any other suitable coordinate system or configuration, may be used to provide a frame of reference of points along the bit face profile and bit face of a drill bit associated with FIG. 3, without departing from the scope of the present disclosure. Additionally, any suitable units may be used. For example, the angular position may be expressed in degrees or in radians.

In FIG. 3, drill bit 301 may include a plurality of blades 326 that may include multiple cutting elements 328. In the illustrated embodiment, drill bit 301 includes only blades 326 that may be primary blades. However, drill bit 301 may include may include more or fewer primary blades or secondary blades than shown in FIG. 3 without departing from the scope of the present disclosure. Although only one cutting element 328 may be shown on each blade 326, multiple cutting elements 328 may be placed on blades 326 according to multiple configurations without departing from the scope of the present disclosure.

FIGS. 4A and 4B illustrate schematic drawings for bit face profiles of drill bit 301 of FIG. 3, in accordance with some embodiments of the present disclosure. To provide a frame of reference, FIGS. 4A and 4B include a z-axis, $Z_a$ that may represent BHA axis 330. The xy-plane of BHA cross-section 310 shown in FIG. 3 may be substantially perpendicular to the z-axis of FIGS. 4A and 4B such that the xy-plane of FIG. 3 may be substantially perpendicular to BHA axis 330. Additionally, the x-axis, $X_a$, and y-axis, $Y_a$, of FIG. 3 may intersect each other at the z-axis of FIGS. 4A and 4B such that the x-axis and y-axis may intersect each other at BHA axis 330.

FIGS. 4A and 4B are generated by plotting $Z_a$ and R to create bit profiles. Bit profiles may represent a projection of the cutting edges of each cutting element on drill bit 301 during a full revolution around BHA axis 330. Bit profiles 400 and 410 represent a projection along radial plane 350. Further, bit profiles 400 and 410 may assume that BHA axis 330 is approximately parallel with bit axis 304.

In FIGS. 4A and 4B, cutting edges of cutting elements 328 are projected onto the bit face profiles 400 and 410, respectively, as drill bit 301 rotates. The cutting edges of cutting elements 328 may wear gradually with drilling distance in a wellbore (e.g., wellbore 114 as illustrated in FIG. 1). As a result, the shape of cutting edges may change and the amount of material on the cutting edges may also change. For example, the cutting layer may be constructed of diamond or other hard material suitable for cutting into a formation as discussed with reference to FIG. 2A. At any point or segment in the bit profile for a PDC drill bit, the volume of the cutting layer, dv, associated with dr, may be calculated by any suitable means of calculating volume of material.

In FIG. 4A, bit axis 304 and BHA axis 330 are aligned such that drill bit 301 is rotating about its own bit axis 304. Each cutting element 328 may contact the formation after rotating drill bit 301 a full rotation about bit axis 304 resulting in an approximately smooth bottom to the wellbore.

In FIG. 4B, bit axis 304 may be off-center from BHA axis 330 by distance δR of approximately 0.5 inches. Bit profile 410 may represent a radial plane at angular coordinate θ of approximately 180 degrees. In this configuration, only some cutting elements 328 may contact the bottom of the wellbore after rotating drill bit 301 a full revolution. Intermittent cutting by cutting elements may result in a bottom to the wellbore, such as wellbore 114 discussed with reference to FIG. 1, that is rough or uneven.

Figure 5:
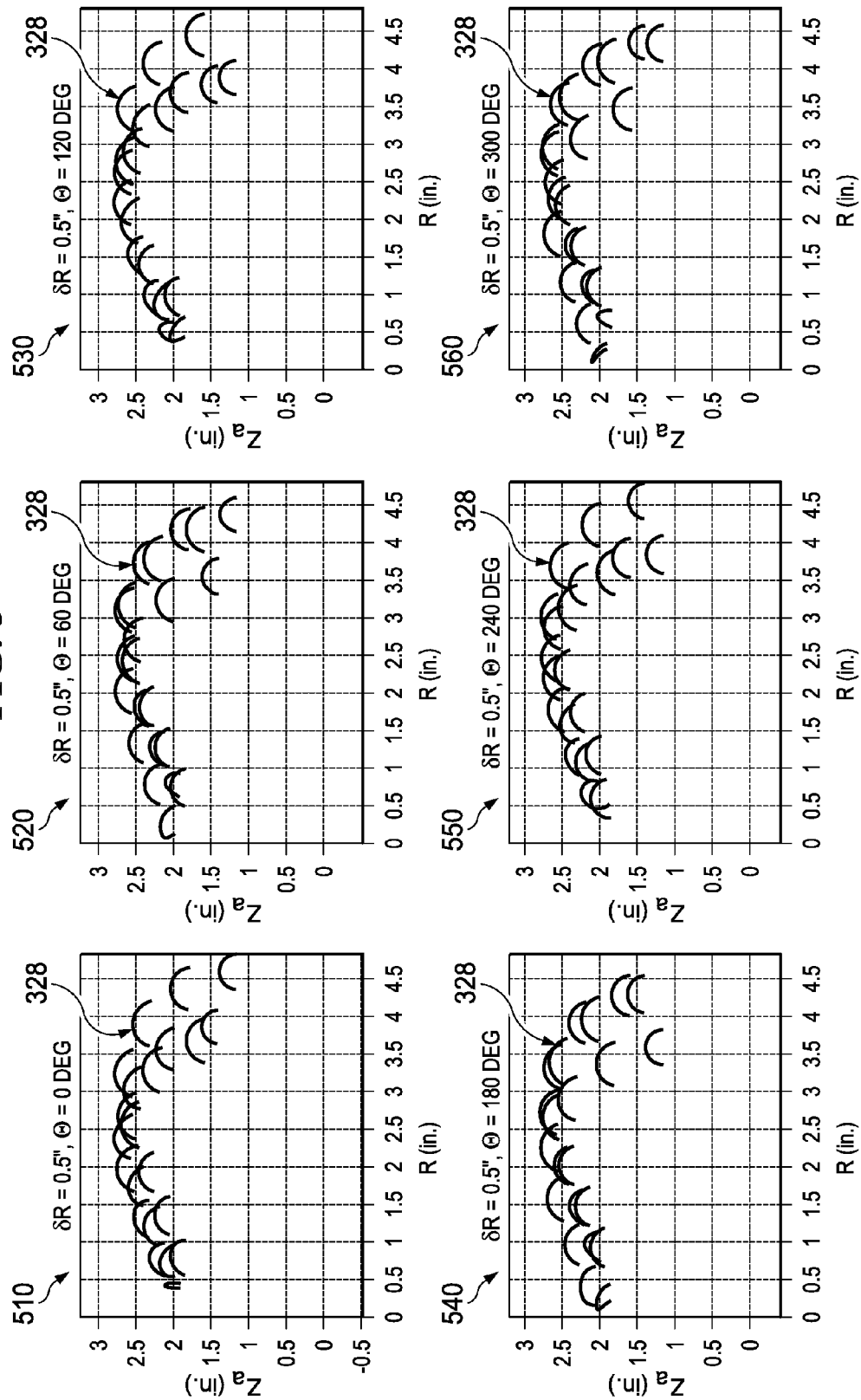
FIG. 5 illustrates schematic drawings for bit face profiles of the drill bit of FIG. 3B with varying angular coordinates θ, in accordance with some embodiments of the present disclosure.
Figure 6:
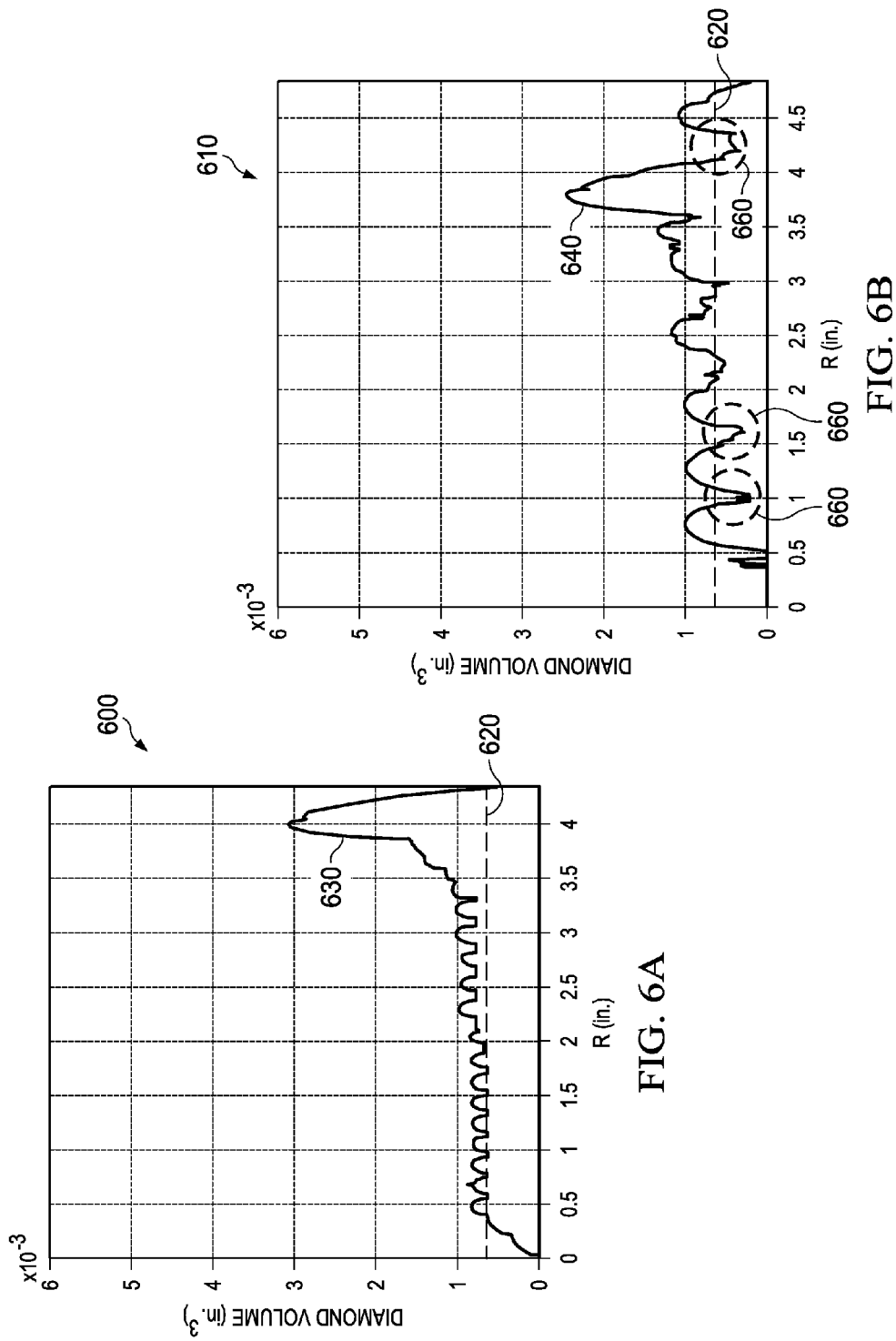
FIGS. 6A and 6B illustrate graphs of cutting layer volume as a function of radial coordinates, in accordance with some embodiments of the present disclosure.

FIG. 5 illustrates schematic drawings for bit face profiles of drill bit 301 of FIG. 3B with varying angular coordinates θ, in accordance with some embodiments of the present disclosure. For each bit profile 510a-510f, distance δR may be fixed at approximately 0.5 inches and the angular coordinate θ may vary. For example, bit profile 510a is obtained by rotationally projecting cutlets of cutting elements into radial plane 350 defined by angular coordinate θ of approximately zero degrees, and bit profile 510b is obtained by rotationally projecting cutlets of cutting elements into another radial plane 350 defined by angular coordinate θ of approximately sixty degrees. Further, bit profiles 510c-510f are obtained by rotationally projecting cutlets of cutting elements into radial planes 350 defined by angular coordinate θ of approximately 120 degrees, 180 degrees, 240 degrees and 300 degrees, respectively. Thus, at varied angular coordinates of the radial plane (e.g., radial plane 350 discussed with reference to FIG. 3) around the wellbore axis, the bit profiles illustrate that different cutting elements 328 may be contacting the formation. Intermittent contact by cutting elements 328 may result in uneven wear of cutting elements and uneven cutting of the formation causing a bottom to the wellbore that is rough or uneven. The amount of uneven wear of cutting elements may be ascertained by determining the cutting layer volume along a bit profile.

Accordingly, FIGS. 6A and 6B illustrate graphs of cutting layer volume 630 and 640, respectively, as a function of radial coordinate R, in accordance with some embodiments of the present disclosure. In some embodiments, a minimum cutting layer volume may be predefined. Predefined minimum cutting layer volume 620 may be based on drill bit configuration (e.g., number of blades or cutting elements), drilling configurations, characteristics of the wellbore, or any other suitable criteria. For instance, an example PDC drill bit may have a predefined minimum diamond layer volume that is predefined at approximately $0.6 \times 10^3$ in$^3$.

FIG. 6A illustrates graph 600 of cutting layer volume 630 based on rotation of drill bit 301 as discussed with reference to FIG. 4A (e.g., bit axis 304 and wellbore axis 330, shown in FIG. 3B, are aligned such that drill bit 301 is rotating about its own bit axis 304). In the illustrated embodiment, graph 600 includes a plot of cutting layer volume 620 as a function of radial coordinate R. As can be seen from graph 600, cutting layer volume 630 remains essentially above predefined minimum cutting layer volume 620 during rotation of drill bit 301. Thus, when drill bit 301 rotates about its own bit axis 304, drill bit 301 may not include weak zones, or areas where cutting layer volume 630 falls below predefined minimum cutting layer volume 620. Predefined minimum cutting layer volume 620 may be based on drill bit configuration (e.g., number of blades or cutting elements), drilling configurations, characteristics of the wellbore, or any other suitable criteria.

FIG. 6B illustrates graph 610 of cutting layer volume 640 based on an angular coordinate (θ) of approximately 180 degrees around wellbore axis 330 as discussed with reference to FIG. 4B (e.g., bit axis 304 off-center from wellbore axis 330 by distance (δR) of approximately 0.5 inches). Graph 610 may include a plot of cutting layer volume 640 as a function of radial coordinate R. As can be seen from graph 610, cutting layer volume 640 dips below predefined minimum cutting layer volume 620 at multiple points for drill bit 301 as discussed in FIG. 4B. Weak zones 660 are identified by radial ranges in which cutting layer volume 640 is less than predefined minimum cutting layer volume 620. Weak zones may be pinpointed at multiple angular coordinates around the wellbore axis to identify the radial locations for design improvement.

Figure 7:
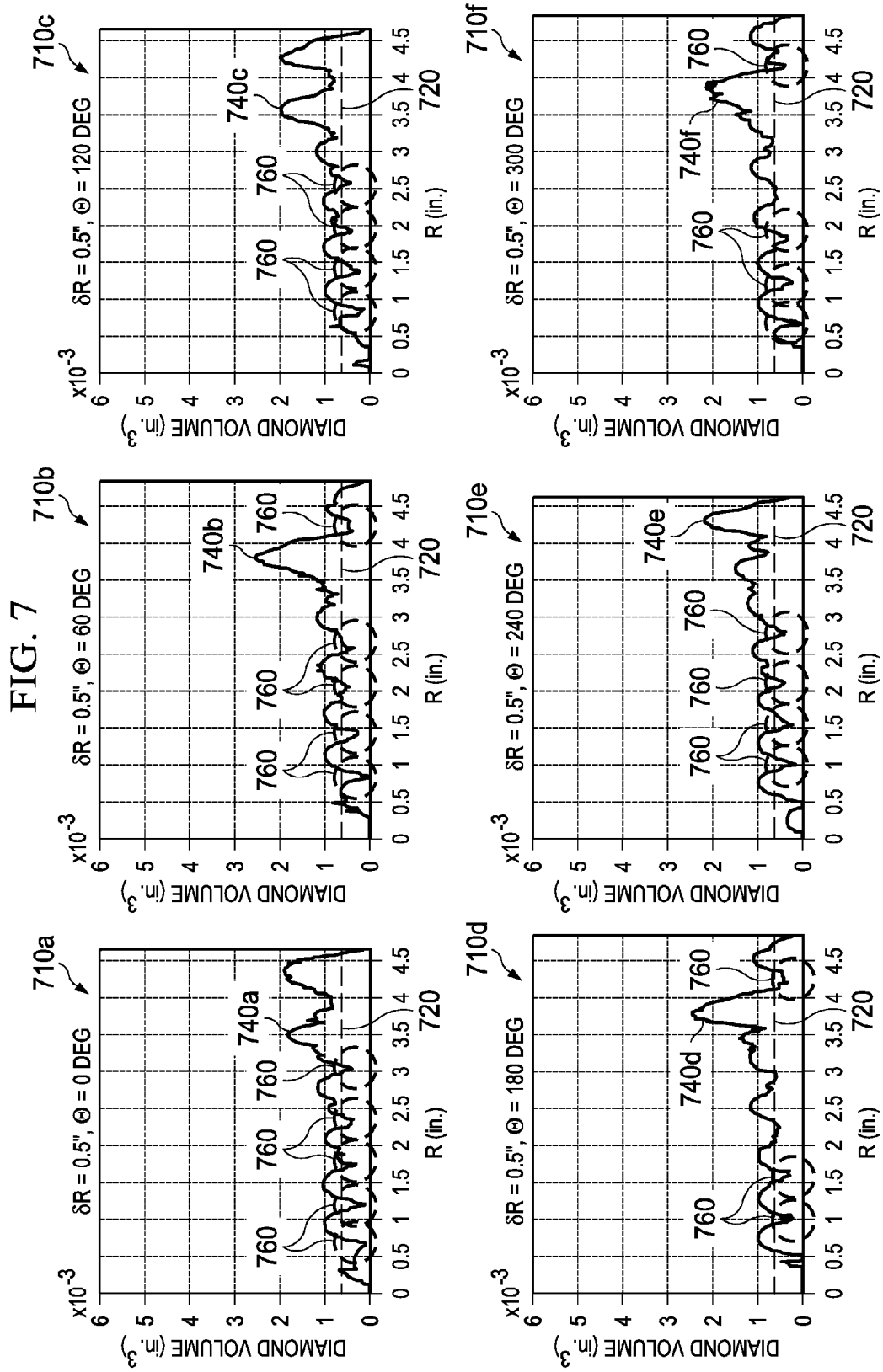
FIG. 7 illustrates graphs of cutting layer volumes based on various angular coordinates (θ) around the wellbore axis as discussed with reference to FIG. 5, in accordance with some embodiments of the present disclosure.

Accordingly, FIG. 7 illustrates graphs 710a-710f of cutting layer volumes 740a-740f based on the various angular coordinates (θ) around the wellbore axis as discussed with reference to FIG. 5, in accordance with some embodiments of the present disclosure. For each graph 710a-710f distance δR may be fixed at approximately 0.5 inches and the angular coordinate θ may vary. For example, graph 710a may result from angular coordinate θ of approximately zero degrees, and graph 710b may result from angular coordinate θ of approximately sixty degrees. Further, graphs 710c-710f may result from angular coordinate θ of approximately 120 degrees, 180 degrees, 240 degrees and 300 degrees, respectively.

In some embodiments, each graph 710a-710f includes a plot of cutting layer volume 720a-720f, respectively, as a function radial coordinate R. As can be seen from graphs 710a-710f, varying angular coordinate θ may result in varied radial coordinates R of weak zones 760. Because each of graphs 710a-710f is based on a off-center rotation of approximately 0.5 inches (e.g., bit axis 304 is off-center from wellbore axis 330), this amount may be subtracted to determine radial coordinate r of each weak zones 760 relative to bit axis 304.

In some embodiments, each of FIGS. 4-8 may be generated by simulation or modeling of a drill bit during off-center rotation utilizing a downhole drilling tool modeling system as discussed with reference to FIG. 9 below. Table 1 illustrates example weak zones 760, relative to bit axis 304, for simulations performed for the configuration of drill bit 301 illustrated in FIG. 3.

| Angular Coordinate (θ) in degrees | Weak Zone Location (r) in inches |
|---|---|
| 0 | 0.15, 0.7, 1.25, 1.82, 2.5 |
| 60 | 0.33, 0.92, 1.58, 2.07, 3.70 |
| 120 | 0.35, 0.89, 1.42, 2.05 |

-continued

| Angular Coordinate (θ) in degrees | Weak Zone Location (r) in inches |
|---|---|
| 180 | 0.53, 1.11, 1.75, 3.70 |
| 240 | 0.50, 1.05, 1.60, 2.30 |
| 300 | 0.17, 0.72, 2.05, 3.62 |

Additional cutting elements or backup cutting elements may be placed at radial locations for weak zones 760 based on availability of space on blades. In some embodiments, weak zones may be located in the cone zone of the drill bit. For example, as discussed with reference to FIG. 2B, the weak zones may be within certain zones of the drill bit, such as cone zone 212 and nose zone 210. However, in some embodiments, weak zones may be in any other zones of the drill bit. In some embodiments, additional cutting elements may be placed at any location along the bit that indicates a weak zone.

In some embodiments, placing cutting elements to minimize weak zones of a drill bit during off-center rotation may be based on a variety of placement techniques. For example, additional cutting elements may be configured as backup cutting elements on the primary blades behind the existing cutting elements. As another example, additional cutting elements may be placed on secondary blades. As discussed with reference to FIG. 2A, additional cutting elements may be track set or single set. Track set cutting elements have radial correspondence such that they are at the same radial position with respect to bit axis 104.

Figure 8:
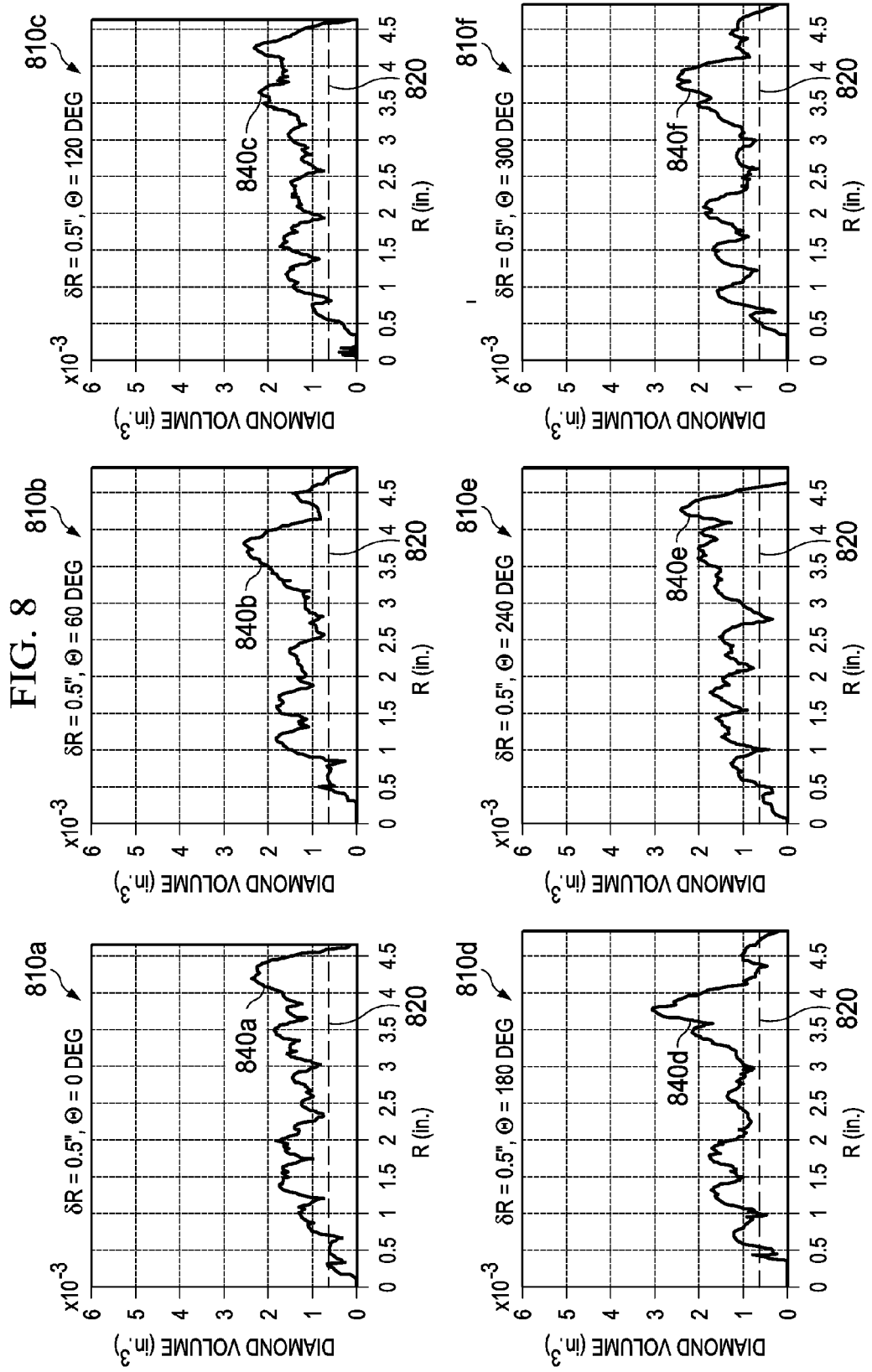
FIG. 8 illustrates graphs of cutting layer volumes based on various angular coordinates (θ) around the wellbore axis with additional cutting elements to compensate for weak zones, in accordance with some embodiments of the present disclosure.

FIG. 8 illustrates graphs 810a-810f of cutting layer volumes 840a-840f based on various angular coordinates (θ) around the wellbore axis with additional cutting elements to compensate for weak zones, in accordance with some embodiments of the present disclosure. Graphs 810a-810f may be generated based on modeling of simulation of a drill bit with the placement of additional cutting elements in each identified weak zone 760 as discussed with reference to FIG. 7. For each graph 810a-810f distance δR may be fixed at approximately 0.5 inches and the angular coordinate θ may vary. For example, graph 810a may result from angular coordinate θ of approximately zero degrees, and graph 810b may result from angular coordinate θ of approximately sixty degrees. Further, graphs 810c-810f may result from angular coordinate θ of approximately 120 degrees, 180 degrees, 240 degrees and 300 degrees, respectively.

In some embodiments, each graph 810a-810f includes a plot of cutting layer volume 820a-820f, respectively, as a function radial coordinate R. As can be seen from graphs 810a-810f, weak zones 760 have been minimized or eliminated from each of the plots of cutting layer volume 820a-820f. Thus, placing additional cutting elements at the location of identified weak zones may minimize or eliminate weak zones.

Modifications, additions or omissions may be made to FIGS. 3-8 without departing from the scope of the present disclosure. For example, as discussed above, the number or placement blades 326, cutting elements 328, DOCCs (not expressly shown) or any combination thereof on drill bit 301 may affect the location of weak zones.

Figure 9:
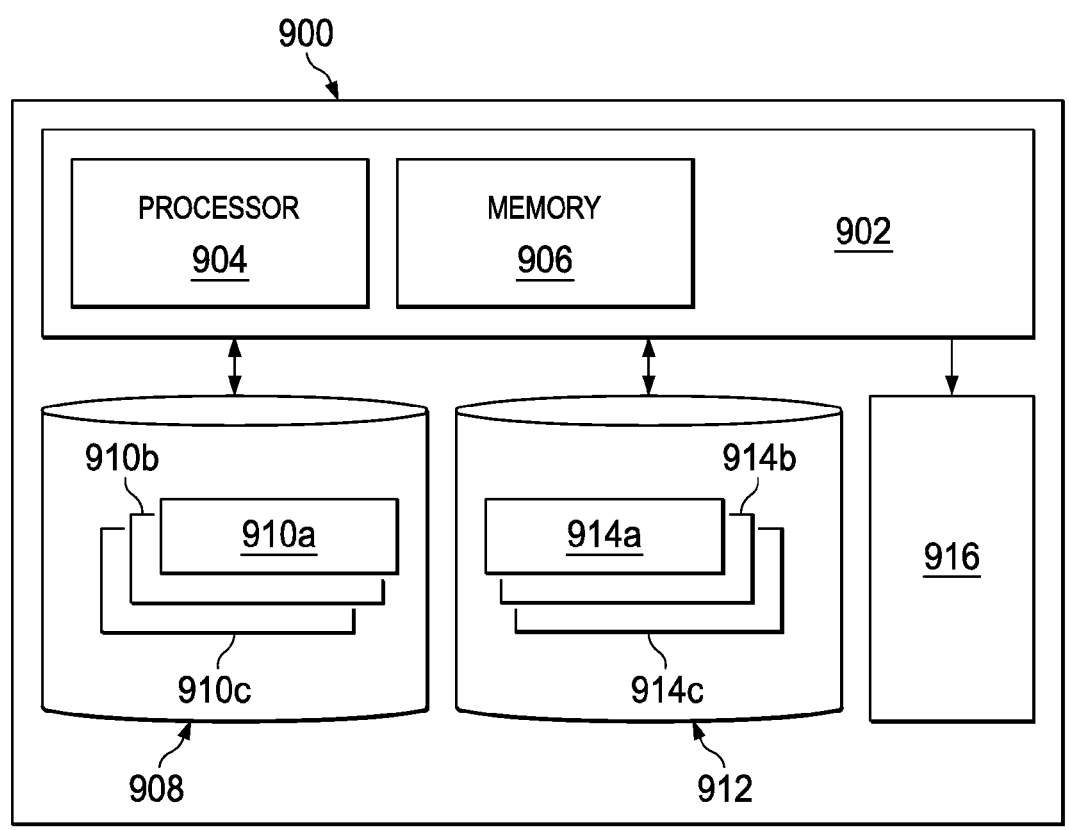
FIG. 9 illustrates a block diagram of an exemplary downhole drilling tool modeling system, in accordance with some embodiments of the present disclosure.

FIG. 9 illustrates a block diagram of an exemplary downhole drilling tool modeling system 900, in accordance with some embodiments of the present disclosure. Downhole drilling tool modeling system 900 may be configured to perform modeling of drill bits during off-center rotation. In some embodiments, downhole drilling tool modeling system 900 may include downhole drilling tool modeling module 902. Downhole drilling tool modeling module 902 may include any suitable components. For example, in some embodiments, downhole drilling tool modeling module 902 may include processor 904. Processor 904 may include, for example a microprocessor, microcontroller, digital signal processor (DSP), application specific integrated circuit (ASIC), or any other digital or analog circuitry configured to interpret and/or execute program instructions and/or process data. In some embodiments, processor 904 may be communicatively coupled to memory 906. Processor 904 may be configured to interpret and/or execute program instructions and/or data stored in memory 906. Program instructions or data may constitute portions of software for carrying out modeling of drill bits during off-center rotation, as described herein. Memory 906 may include any system, device, or apparatus configured to hold and/or house one or more memory modules; for example, memory 906 may include read-only memory, random access memory, solid state memory, or disk-based memory. Each memory module may include any system, device or apparatus configured to retain program instructions and/or data for a period of time (e.g., computer-readable non-transitory media).

Downhole drilling tool modeling system 900 may further include bit design database 908. Bit design database 908 may be communicatively coupled to downhole drilling tool modeling module 902 and may provide drill bit designs 910a-910c in response to a query or call by downhole drilling tool modeling module 902. Drill bit designs 910a-910c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Drill bit designs 910a-910c may specify any suitable configuration of components of a drill bit, such as, for example, components of drill bit 101, discussed above with reference to FIGS. 1, 2A and 2B. Although bit design database 908 is illustrated as including three drill bit designs, bit design database 908 may contain any suitable number of drill bit designs.

Downhole drilling tool modeling system 900 may further include cutting layer property database 912. Cutting layer property database 912 may be communicatively coupled to downhole drilling tool modeling module 902 and may provide cutting layer parameters 914a-914c in response to a query or call by downhole drilling tool modeling module 902. Cutting layer parameters 914a-914c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Although cutting layer database 912 is illustrated as including three instances of cutting layer parameters, cutting layer database 912 may contain any suitable number of instances of cutting layer parameters.

In some embodiments, downhole drilling tool modeling module 902 may be configured to perform three dimensional modeling of interactions between drill bits and wellbores. For example, downhole drilling tool modeling module 902 may be configured to import one or more instances of drill bit designs 910a-910c, and/or one or more instances of cutting layer parameters 914a-914c. Drill bit designs 910a-910c, and/or cutting layer parameters 914a-914c may be stored in memory 906. Downhole drilling tool modeling module 902 may be further configured to cause processor 904 to execute program instructions operable to perform modeling of a drill bit during off-center rotation. For example, processor 904 may, based on drill bit designs 910a-910c, generate a model of an initial borehole bottom by modeling a full revolution of a drill bit represented in drill bit designs 910a-910c.

Downhole drilling tool modeling module 902 may be further configured to cause processor 906 to determine a position of one or more cutting elements on one or more blades of a drill bit, such as cutting elements 128 of FIG. 1. Downhole drilling tool modeling module 902 may also be configured to identify locations for one or more cutlets associated with cutting elements and generate bit profiles. For example, downhole drilling tool modeling module 902 may determine the volume of a cutting layer for cutting elements. Additionally, downhole drilling tool modeling module 902 may be configured to model drill bits during off-center rotation for each cutting element, Downhole drilling tool modeling module 902 may be communicatively coupled to various displays 916 such that information processed by downhole drilling tool modeling module 902 may be conveyed to operators and designers of drilling equipment.

Figure 10:
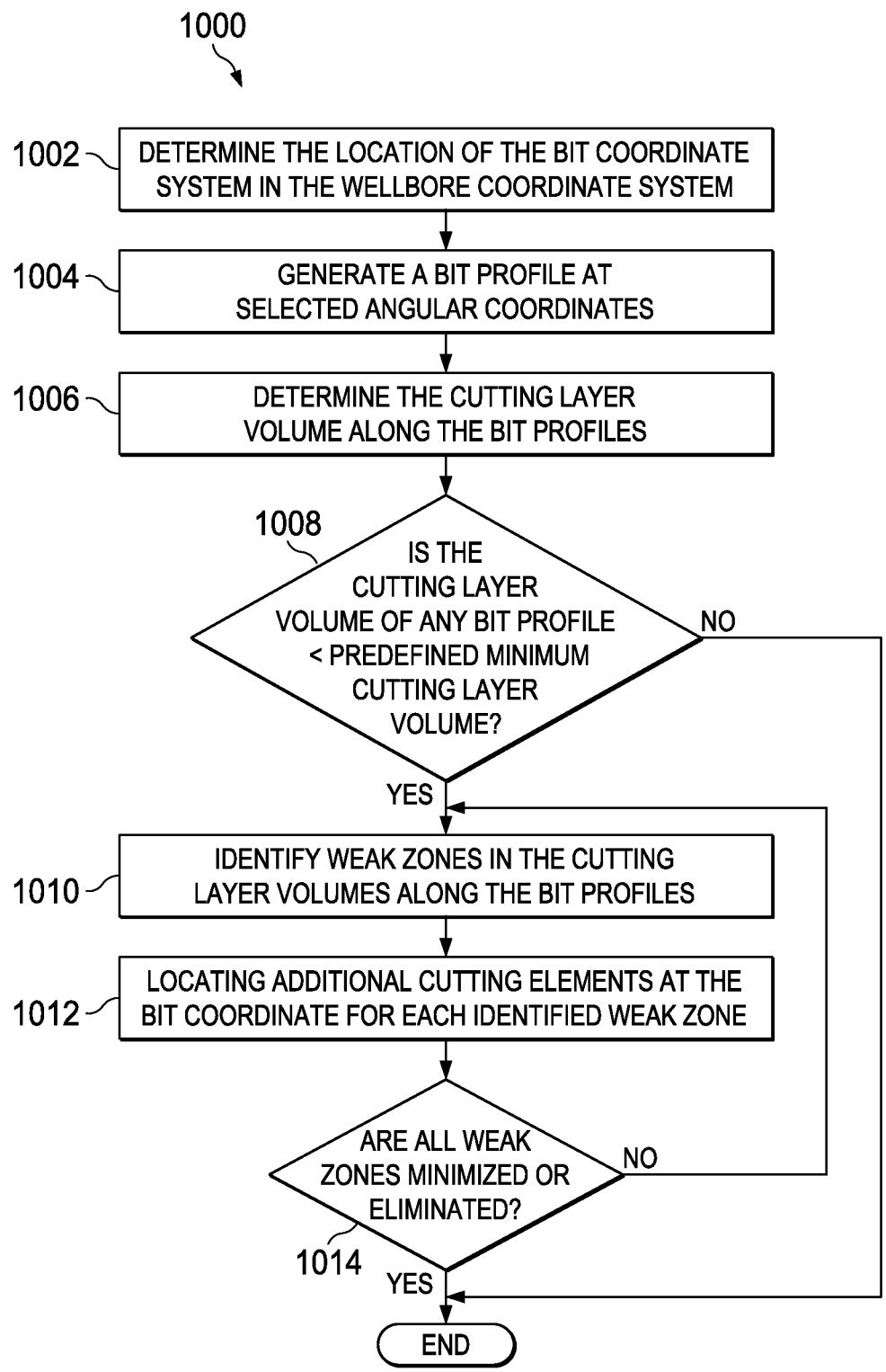
FIG. 10 illustrates a flow chart of an example method for identification of weak zones in rotary drill bits during off-center rotation, in accordance with some embodiments of the present disclosure.

FIG. 10 illustrates a flow chart of example method 1000 for identification of weak zones in rotary drill bits during off-center rotation, in accordance with some embodiments of the present disclosure. The steps of method 1000 may be performed by various computer programs, models or any combination thereof, configured to simulate and design drilling systems, apparatuses and devices. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs and models used to simulate and design drilling systems may be referred to as a "drilling engineering tool" or "downhole drilling tool model."

In the illustrated embodiment, the cutting structures of the drill bit, including at least the locations and orientations of all cutting elements and DOCCs, may have been previously designed. However in other embodiments, method 1000 may include steps for designing the cutting structure of the drill bit. For illustrative purposes, method 1000 is described with respect to drill bit 301 illustrated in FIG. 3; however, method 1000 may be used to identify weak zones during off-center rotation for any suitable drill bit.

Method 1000 may start, and at step 1002, the downhole drilling tool model determines the location of the bit coordinate system in the wellbore coordinate system as shown in FIGS. 3A and 3B. If the bit axis is assumed to be parallel to the wellbore axis, the location of the bit coordinate system in the wellbore coordinate system may be determined by the distance $\delta R$ between a wellbore axis and a bit center located on a bit axis. The estimation of the distance $\delta R$ may be based on wellbore measurement. An oversized hole may be drilled by a drill bit. In this case, $\delta R = Rh - Rb$ where $Rh$ is the wellbore radius and $Rb$ is the bit radius. For example, as discussed with reference to FIG. 3B, distance $\delta R$ may be estimated to be approximately 0.5 inches. If the drill bit is utilizing a downhole motor, the location of the bit coordinate system in the wellbore coordinate system may be determined by the bend length and bend angle of the motor.

At step 1004, the downhole drilling tool model generates a bit profile at various angular coordinates θ around the wellbore axis between approximately zero and 360 degrees. In some embodiments, the minimum number of angular coordinates θ around the wellbore axis may be based on the number of blades. The number of angular coordinates θ selected may be based on the drill bit design, accuracy for the model (e.g., additional angular coordinates may be included if improved accuracy is needed), or any other suitable factor.

At step 1006, the downhole drilling tool model determines the cutting layer volume on the cutting edges of each cutting elements shown by a bit profile at each of the angular coordinates θ around the wellbore axis. For example, FIG. 7 illustrates cutting layer volume as a function of radial coordinate R for each of the angular coordinates θ around the wellbore axis determined in FIG. 5.

At step 1008, the downhole drilling tool model determines if the cutting layer volume of any of the bit profiles is less than a predefined minimum cutting layer volume. The predefined minimum cutting layer volume may be predefined based on the design of the drill bit, the formations to be drilled, or any other suitable factor. If the cutting layer volume is less than the predefined minimum cutting layer volume, method 100 proceeds to step 1010, if not, method 1000 ends.

At step 1010, the downhole drilling tool model identifies weak zones in the cutting layer volume along the bit profile. Where the plots of cutting layer volume are less than the predefined minimum cutting layer volume, the radial coordinate R may be identified as a weak zone on the cutting edges of each cutting element. Weak zones are areas where the cutting layer volume is less than a predefined minimum cutting layer volume. Each of the radial coordinates R for each respective weak zone may be adjusted to a bit coordinate by removing the distance δR. For example, as discussed with reference to FIG. 7 radial coordinates R for each weak zone 760 may be identified and adjusted to bit axis 304 (e.g., subtracting δR=0.5 inches from each coordinate) resulting in Table 1.

At step 1012, the downhole drilling tool model configures additional cutting elements at the bit coordinate for each identified weak zone. For example, additional cutting elements may be configured as backup cutting elements on the primary blades behind the existing cutting elements. As another example, additional cutting elements may be placed on secondary blades. Additional cutting elements may be track set or single set. Cutting element size, back rake, side rake and other characteristics of the additional cutting elements may be varied.

At step 1014, the downhole drilling tool model determines whether the weak zones are minimized or eliminated. For example, as discussed with reference to FIG. 8, the addition of cutting elements may result in cutting layer volumes distributions that have few or no weak zones. If additional weak zones are to be compensated for, method 1000 may return to step 1010.

Modifications, additions, or omissions may be made to method 900 without departing from the scope of the present disclosure. For example, the order of the steps may be performed in a different manner than that described and some steps may be performed at the same time. Additionally, each individual step may include additional steps without departing from the scope of the present disclosure.

Further, method 1000 may be used to determine weak zones of any suitable drill bit. For example, a bi-center bit may include a pilot bit that rotates around its own axis and a reamer section that rotates off center. The cutting elements on the bi-center bit may have weak zones identified using the techniques described in method 1000. Further, an optimized angular coordinate θ may be determined which gives the minimal number of weak zones for the reamer bit of a bi-center bit.

Although the present disclosure and its advantages have been described in detail, it should be understood that various changes, substitutions and alternations can be made herein without departing from the spirit and scope of the disclosure as defined by the following claims. For example, although the present disclosure describes the configurations of blades and cutting elements with respect to drill bits, the same principles may be used to control the depth of cut of any suitable drilling tool according to the present disclosure. It is intended that the present disclosure encompasses such changes and modifications as fall within the scope of the appended claims.

What is claimed is:

1. A downhole drilling tool designed for drilling a wellbore, comprising:
   a bit body including a bit axis;
   a plurality of blades on exterior portions of the bit body;
   a first cutting element on an exterior portion of a first blade;
   a weak zone associated with the first cutting element, the weak zone identified by determining a cutting layer volume is less than a predefined minimum cutting layer volume based on a bit profile generated from an angular coordinate around a wellbore axis of a wellbore and a bit coordinate system; and
   a second cutting element on the exterior portion of a second blade to compensate for the weak zone.

2. The drilling tool of claim 1, wherein the bit profile is further based on a cutting edge of the first cutting element.

3. The drilling tool of claim 2, wherein the weak zone has a radial coordinate based on the wellbore axis.

4. The drilling tool of claim 3, wherein the weak zone has an adjusted radial coordinate based on the bit axis.

5. The drilling tool of claim 4, wherein the second cutting element is located based on the adjusted radial coordinate.

6. The drilling tool of claim 1, wherein the location of the weak zone is in a cone zone of the first blade.

7. The drilling tool of claim 1, wherein the second cutting element is track set with the first cutting element.

8. The drilling tool of claim 1, wherein the bit coordinate system is based on a wellbore coordinate system.

* * * * *